(12) United States Patent
Sano et al.

(10) Patent No.: US 12,453,003 B2
(45) Date of Patent: Oct. 21, 2025

(54) STRETCHABLE DEVICE

(71) Applicant: Magnolia White Corporation, Tokyo (JP)

(72) Inventors: Takumi Sano, Tokyo (JP); Masatomo Hishinuma, Tokyo (JP); Yasushi Tomioka, Tokyo (JP); Akio Murayama, Tokyo (JP); Shinichiro Oka, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 157 days.

(21) Appl. No.: 18/480,507

(22) Filed: Oct. 4, 2023

(65) Prior Publication Data

US 2024/0121893 A1     Apr. 11, 2024

(30) Foreign Application Priority Data

Oct. 7, 2022 (JP) ................................ 2022-162260

(51) Int. Cl.
*H05K 1/02* (2006.01)

(52) U.S. Cl.
CPC . *H05K 1/0283* (2013.01); *H05K 2201/10151* (2013.01)

(58) Field of Classification Search
CPC .... H05K 1/0283; H05K 1/028; H05K 1/0281; H05K 2201/10151; H05K 2201/10; H05K 2201/10431; H05K 1/00; H05K 1/02; H05K 1/118; H05K 1/09; H10K 77/111; H10K 77/10

USPC .................. 174/254, 255, 260, 261; 361/749
See application file for complete search history.

(56) References Cited

U.S. PATENT DOCUMENTS

| | | | |
|---|---|---|---|
| 11,621,399 B2 | 4/2023 | Sano | |
| 11,627,657 B2 * | 4/2023 | Hsu | H05K 1/095 174/254 |
| 11,810,906 B2 * | 11/2023 | Kim | H10H 29/142 |
| 12,112,668 B2 * | 10/2024 | Iwai | H05K 1/118 |
| 12,118,167 B2 * | 10/2024 | Sano | G06F 3/044 |
| 12,267,951 B2 * | 4/2025 | Sano | H05K 1/0283 |
| 2017/0181276 A1 * | 6/2017 | Sawada | B32B 27/38 |

FOREIGN PATENT DOCUMENTS

JP     2021-118273 A     8/2021

* cited by examiner

*Primary Examiner* — Angel R Estrada
(74) *Attorney, Agent, or Firm* — XSENSUS LLP

(57) ABSTRACT

According to an aspect, a stretchable device includes: a resin base member; and a signal line and a strain gauge stacked on the resin base member. The resin base member includes: a plurality of bodies disposed separately from each other; and a plurality of hinges that couple the bodies while meandering. The hinges each include: a plurality of bends that bend and are disposed between the bodies; and a base that linearly extends to couple one of the bodies to a corresponding one of the bends. The signal line includes: a bend signal line stacked on the bends; and a base signal line stacked on the base. The base signal line has an occupied area per unit length in a length direction of the signal line larger than the bend signal line when viewed in a stacking direction in which the signal line is stacked on the resin base member.

10 Claims, 14 Drawing Sheets

STRETCHABLE DEVICE

CROSS-REFERENCE TO RELATED APPLICATION

This application claims the benefit of priority from Japanese Patent Application No. 2022-162260 filed on Oct. 7, 2022, the entire contents of which are incorporated herein by reference.

BACKGROUND

1. Technical Field

What is disclosed herein relates to a stretchable device.

2. Description of the Related Art

Stretchable devices have excellent elasticity and flexibility. Such stretchable devices include a resin base member on which an array layer is stacked. The resin base member includes bodies arrayed in a matrix (row-column configuration) and hinges that couple the bodies to each other. The hinge described in Japanese Patent Application Laid-open Publication No. 2021-118273 includes a plurality of arcs and has a meandering shape. The hinge may have a linear base that couples the arc to the body. When a tensile load acts on the stretchable device, the arcs of the hinge deform to have a smaller curvature. In other words, the arcs deform to expand. As a result, the bodies are separated from each other, and the stretchable device extends.

In recent years, it has been considered to provide a strain gauge to the hinge and detect the amount of strain in the hinge to detect the load acting on the stretchable device. In such a stretchable device, a signal line is stacked on the hinge, and an electric current flows from the signal line to the strain gauge. When the hinge expands or contracts, however, the amount of strain generated in the base is large. Therefore, a lot of strain is generated in the part of the signal line stacked on the base. As a result, the amount of strain in the hinge fails to be accurately detected.

For the foregoing reasons, there is a need for a stretchable device that can accurately detect the amount of strain in a hinge.

SUMMARY

According to an aspect, a stretchable device includes: a resin base member; and a signal line and a strain gauge stacked on the resin base member. The resin base member includes: a plurality of bodies disposed separately from each other; and a plurality of hinges that couple the bodies while meandering. The hinges each include: a plurality of bends that bend and are disposed between the bodies; and a base that linearly extends to couple one of the bodies to a corresponding one of the bends. The signal line includes: a bend signal line stacked on the bends; and a base signal line stacked on the base. The base signal line has an occupied area per unit length in a length direction of the signal line larger than the bend signal line when viewed in a stacking direction in which the signal line is stacked on the resin base member.

According to an aspect, a stretchable device includes: a resin base member; and a signal line and a strain gauge stacked on the resin base member. The resin base member includes: a plurality of bodies disposed separately from each other; and a plurality of hinges that couple the bodies while meandering. The hinges each include: a plurality of bends that bend and are disposed between the bodies; and a base that linearly extends to couple one of the bodies to a corresponding one of the bends. The signal line includes: a bend signal line stacked on the bends; and a base signal line stacked on the base. The base signal line comprises a signal line body coupled to the bend signal line. An annular portion having an annular shape when viewed in a stacking direction in which the signal line is stacked on the resin base member is provided to at least part of the signal line body.

DETAILED DESCRIPTION

Figure 1:
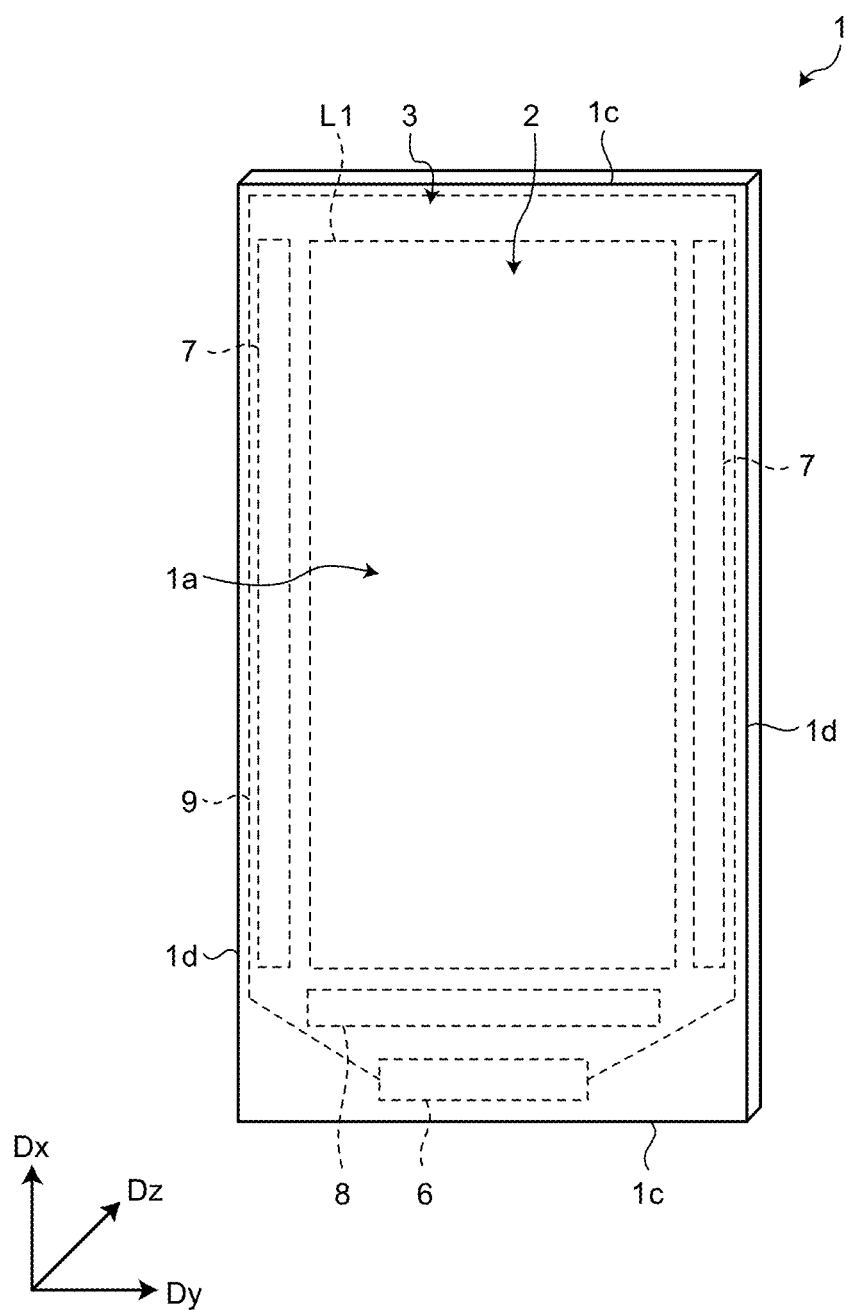
FIG. 1 is a schematic perspective view of a stretchable device according to a first embodiment.

Exemplary aspects (embodiments) to embody the present disclosure are described below in greater detail with reference to the accompanying drawings. The contents described in the embodiments below are not intended to limit the invention according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect.

These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a schematic perspective view of a stretchable device according to a first embodiment. As illustrated in FIG. 1, this stretchable device 1 has a flat plate shape. The stretchable device 1 has a surface 1a and a back surface 1b (not illustrated in FIG. 1, and refer to FIG. 2) facing opposite to each other. In the following description, the direction parallel to the surface 1a and the back surface 1b is referred to as a planar direction. A direction parallel to the planar direction is referred to as a first direction Dx. A direction parallel to the planar direction and intersecting the first direction Dx is referred to as a second direction Dy.

The surface 1a and the back surface 1b has a rectangular (quadrilateral) shape. The surface 1a has a pair of short sides 1c and a pair of long sides 1d. The first direction Dx according to the present embodiment is a direction parallel to the long side 1d. The second direction Dy is a direction parallel to the short side 1c. In other words, the first direction Dx and the second direction Dy according to the present embodiment are orthogonal to each other. The normal direction (stacking direction) of the surface 1a is referred to as a third direction Dz. The view of the stretchable device 1 in the third direction Dz may be referred to as plan view.

The stretchable device 1 is divided into a detection region 2 and a peripheral region 3 in plan view. The detection region 2 is a region in which the amount of strain of the stretchable device 1 can be detected. The peripheral region 3 is a frame-like region surrounding the outer periphery of the detection region 2. In FIG. 1, a boundary line L1 is drawn to make the boundary between the detection region 2 and the peripheral region 3 easy to understand.

Figure 2:
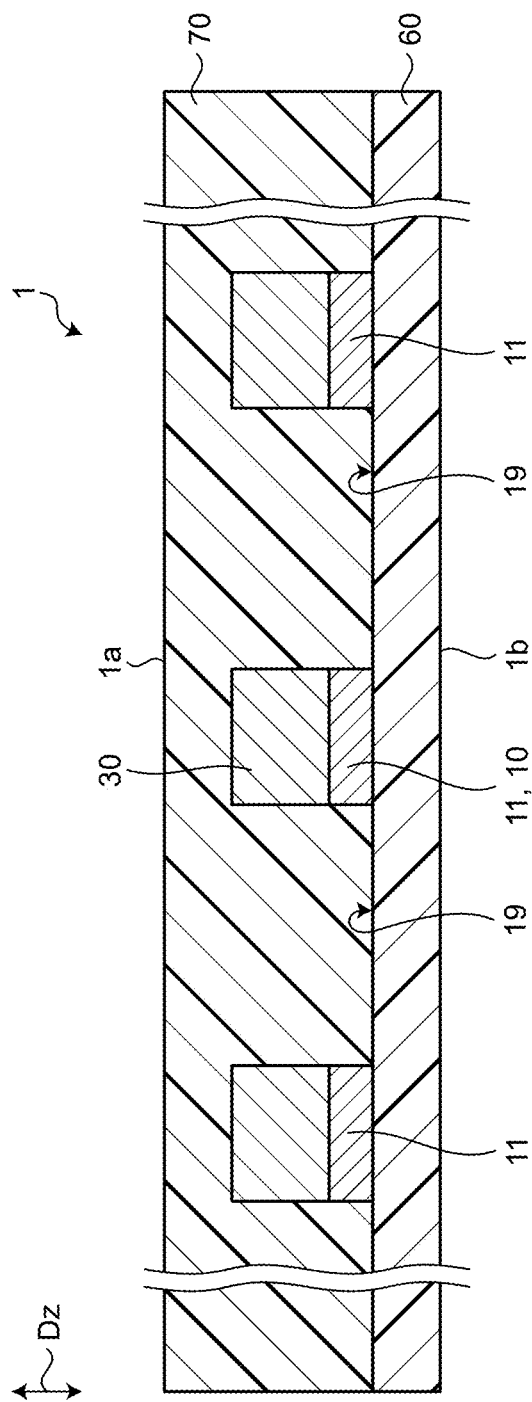
FIG. 2 is a schematic of a section of the stretchable device according to the first embodiment, and more specifically a sectional view along line II-II of FIG. 3.
Figure 3:
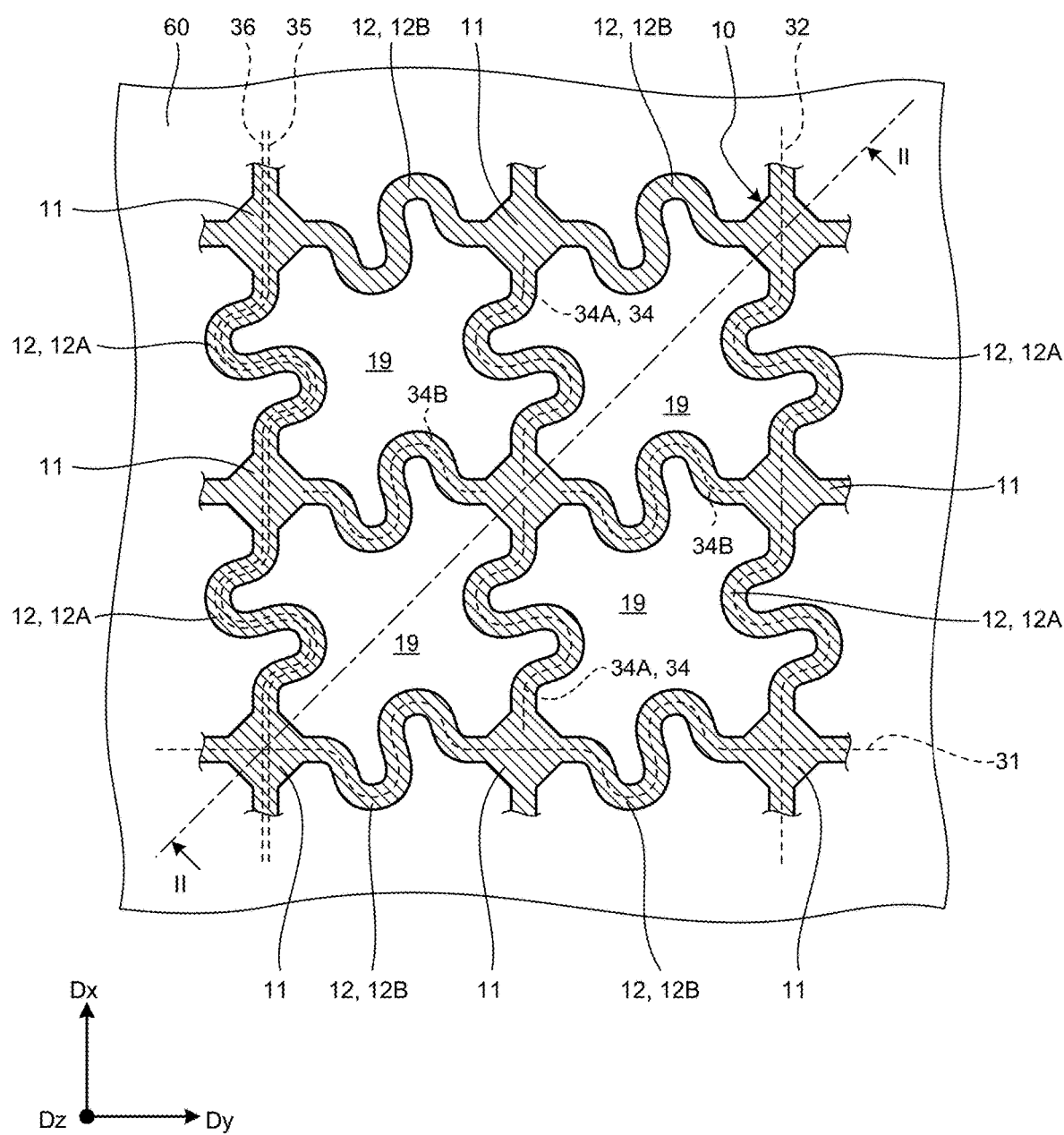
FIG. 3 is an enlarged view of part of a resin base member and a first resin plate of the stretchable device according to the first embodiment viewed from an array layer.

FIG. 2 is a schematic of a section of the stretchable device according to the first embodiment, and more specifically a sectional view along line II-II of FIG. 3. As illustrated in FIG. 2, the stretchable device 1 includes a first resin plate 60, a second resin plate 70, a resin base member 10, and an array layer 30. The first resin plate 60 has the back surface 1b. The second resin plate 70 has the surface 1a. The resin base member 10 and the array layer 30 are sandwiched between the first resin plate 60 and the second resin plate 70. The resin base member 10 and the array layer 30 are stacked in this order on the surface of the first resin plate 60 opposite to the back surface 1b.

The first resin plate 60 and the second resin plate 70 are made of resin material and have elasticity and flexibility. While examples of the resin material include, but are not limited to, acrylic resin, epoxy resin, urethane resin, etc., the present disclosure is not limited thereto. In the following description, the upper side or upward refers to one side in the third direction Dz and the side on which the second resin plate 70 is positioned when viewed from the first resin plate 60. The lower side or downward refers to the other side in the third direction Dz and the side on which the first resin plate 60 is positioned when viewed from the second resin plate 70.

FIG. 3 is an enlarged view of part of the resin base member and the first resin plate of the stretchable device according to the first embodiment viewed from the array layer. In FIG. 3, the resin base member 10 is hatched to make it easy to see the resin base member 10. The resin base member 10 is provided on the upper surface of the first resin plate 60. The resin base member 10 has elastic, flexible, and insulating properties. The resin base member 10 is made of resin material, such as polyimide.

The resin base member 10 includes bodies 11 and hinges 12. The bodies 11 are arrayed in a matrix (row-column configuration) in the first direction Dx and the second direction Dy. The hinges 12 couple the adjacent bodies 11.

The body 11 according to the present embodiment has a rectangular (square) shape in plan view. The four corners of the body 11 are disposed along the first direction Dx and the second direction Dy. The array layer 30 stacked on the body 11 includes a transistor 31 (refer to FIG. 5). The shape of the body 11 according to the present disclosure in plan view is not limited to a rectangular shape and may be circular or other polygonal shapes.

The hinges 12 include longitudinal hinges 12A and lateral hinges 12B. The longitudinal hinge 12A extends in the first direction Dx. The lateral hinge 12B extends in the second direction Dy. The array layer 30 stacked on the longitudinal hinge 12A includes a signal line 32, a strain gauge 34, a first output line 35, and a second output line 36. By contrast, the array layer 30 stacked on the lateral hinge 12B includes a gate line 33 and a strain gauge 34. The hinge 12 will be described later in greater detail.

The part between the bodies 11 and the hinges 12 serves as a hollow portion 19 passing through the resin base member 10 in the third direction Dz. Therefore, the resin base member 10 has a plurality of hollow portions 19.

The array layer 30 is not stacked on the regions overlapping the hollow portions 19. As illustrated in FIG. 2, the hollow portion 19 is filled with the second resin plate 70. With this configuration, the stretchable device 1 has low rigidity in the area overlapping the hollow portion 19 and has elasticity and bendability (stretchability). When a load acts on the stretchable device 1, the hinges 12 overlapping the hollow portions 19 in the first direction Dx or the second direction Dy are deformed. This mechanism reduces the amount of deformation in the bodies 11 and suppresses damage to functional elements (transistors 31 according to the present embodiment) stacked on the bodies 11. While the hollow portion 19 according to the present embodiment is filled with the second resin plate 70, it may be filled with the first resin plate 60 or the first resin plate 60 and the second resin plate 70.

The following describes the array layer 30. The array layer 30 includes various components for detecting the amount of strain of the hinge 12.

Figure 4:
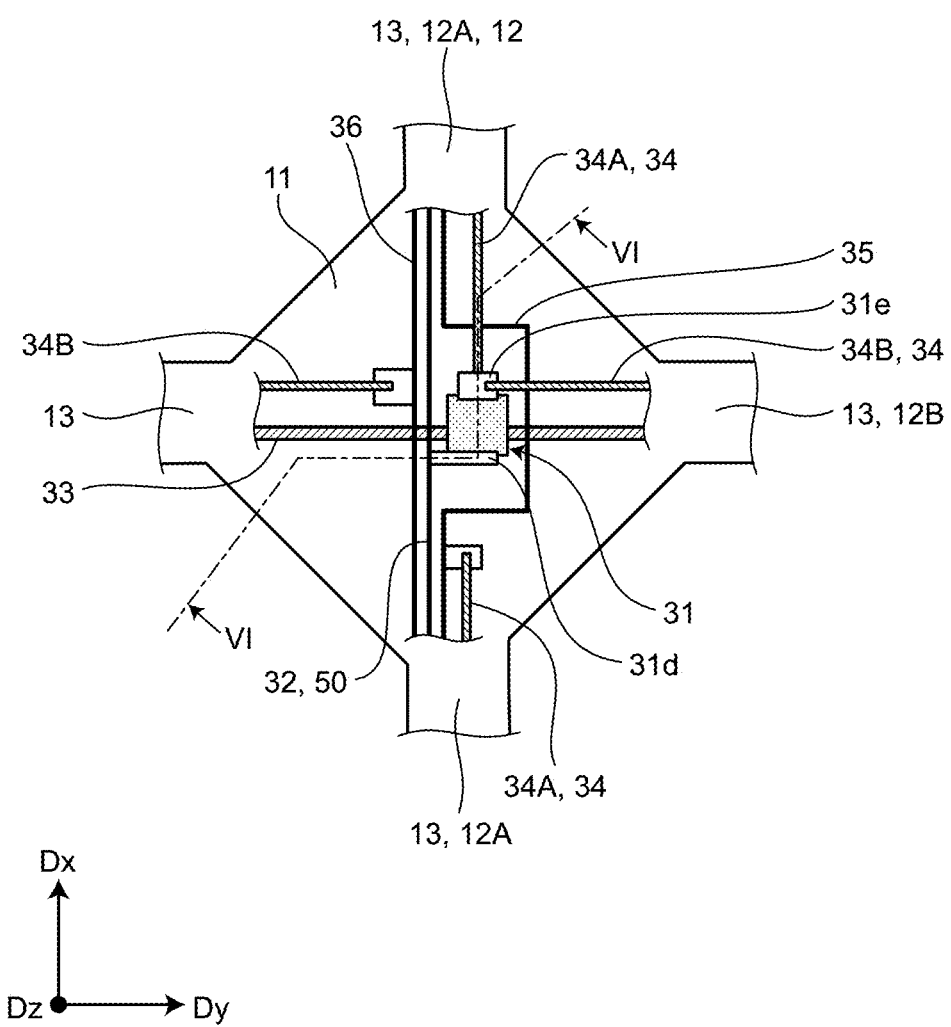
FIG. 4 is a plan view of a part of the array layer according to the first embodiment stacked on the body viewed from a second resin plate.

Specifically, the array layer 30 includes a coupler 6 (refer to FIG. 1), a gate line drive circuit 7 (refer to FIG. 1), an output line selection circuit 8 (refer to FIG. 1), current wiring 9 (refer to FIG. 1), a plurality of transistors 31 (refer to FIG. 4), a plurality of signal lines 32 extending in the first direction Dx (refer to FIG. 4), a plurality of gate lines 33 extending in the second direction Dy (refer to FIG. 4), a plurality of strain gauges 34 (refer to FIG. 4), a plurality of first output lines 35 extending in the first direction Dx (refer to FIG. 4), and a plurality of second output lines 36 extending in the first direction Dx (refer to FIG. 4).

As illustrated in FIG. 1, the coupler 6, the gate line drive circuit 7, the output line selection circuit 8, and the current wiring 9 are disposed overlapping the peripheral region 3. The coupler 6 is coupled to a drive integrated circuit (IC) disposed outside the stretchable device 1. The drive IC may be mounted as a chip on film (COF) on a flexible printed circuit board or a rigid board, which is not illustrated, and coupled to the coupler 6. Alternatively, the drive IC may be mounted as a chip on glass (COG) in the peripheral region 3 of the first resin plate 60.

The gate line drive circuit 7 is a circuit that drives the gate lines 33 based on various control signals supplied from the drive IC. The gate line drive circuit 7 sequentially or simultaneously selects the gate lines 33 and supplies gate drive signals to the selected gate line 33. The output line selection circuit 8 is a switch circuit that sequentially or simultaneously selects the first output lines 35 and the second output lines 36. The output line selection circuit 8 is a multiplexer, for example. The output line selection circuit 8 couples the selected first output line 35 or the selected second output line 36 to the drive IC based on selection signals supplied from the drive IC. The current wiring 9 is wiring for supplying a predetermined amount of electric current to the signal lines 32 and extends along the peripheral region 3. The current wiring 9 is coupled to the drive IC via the coupler 6, and a predetermined amount of electric current flows through it.

The transistors 31, the signal lines 32, the gate lines 33, the strain gauges 34, the first output lines 35, and the second output lines 36 are stacked on the resin base member 10 (refer to FIG. 3) and are disposed in the detection region 2 (refer to FIG. 1).

As illustrated in FIG. 3, the signal line 32 is disposed over a plurality of longitudinal hinges 12A and a plurality of bodies 11. As a result, the signal line 32 continuously extends from one end to the other of the detection region 2 in the first direction Dx. The signal lines 32 are arrayed in the second direction Dy. One end of each signal line 32 is coupled to the current wiring 9 (refer to FIG. 1). The part of the signal line 32 stacked on the body 11 is hereinafter referred to as a body signal line 50.

The gate line 33 is disposed over the lateral hinges 12B and the bodies 11. As a result, the gate line 33 continuously extends from one end to the other of the detection region 2 in the second direction Dy. The gate lines 33 are arrayed in the first direction Dx. One end of each gate line 33 is coupled to the gate line drive circuit 7 (refer to FIG. 1).

The first output line 35 and the second output line 36 are wiring through which output signals (electric current) from the strain gauge 34 flow. The first output line 35 and the second output line 36 are disposed over the longitudinal hinges 12A and the bodies 11. As a result, the first output line 35 and the second output line 36 continuously extend from one end to the other of the detection region 2 in the first direction Dx. One end of each of the first output lines 35 and the second output lines 36 is coupled to the output line selection circuit 8.

FIG. 4 is a plan view of a part of the array layer according to the first embodiment stacked on the body viewed from the second resin plate. As illustrated in FIG. 4, the transistors 31 are stacked on the respective bodies 11 of the resin base member 10. Therefore, the transistors 31 are arrayed in a matrix (row-column configuration) in the detection region 2. The transistor 31 is disposed at the center of the body 11 in plan view. A gate electrode 31c (refer to FIG. 6) of the transistor 31 is coupled to the gate line 33 extending in the second direction Dy above the body 11. A drain electrode 31d of the transistor 31 is coupled to the signal line 32 extending in the first direction Dx above the body 11.

As illustrated in FIG. 3, the strain gauge 34 is wiring for measuring the amount of strain in the hinge 12. The strain gauges 34 are stacked on the respective hinges 12. Thus, the strain gauges 34 include longitudinal strain gauges 34A and lateral strain gauges 34B. The longitudinal strain gauge 34A is stacked on the longitudinal hinge 12A and extends in the first direction Dx. The lateral strain gauge 34B is stacked on the lateral hinge 12B and extends in the second direction Dy.

As illustrated in FIG. 4, one end of the longitudinal strain gauge 34A is disposed on one of the two bodies 11 that sandwich the longitudinal hinge 12A and is coupled to a source electrode 31e of the transistor 31. The other end of the longitudinal strain gauge 34A is disposed on the other of the two bodies 11 that sandwich the longitudinal hinge 12A and is coupled to the first output line 35.

As illustrated in FIG. 4, one end of the lateral strain gauge 34B is disposed on one of the two bodies 11 that sandwich the lateral hinge 12B and is coupled to the source electrode 31e of the transistor 31. The other end of the lateral strain gauge 34B is provided on the other of the two bodies 11 that sandwich the lateral hinge 12B and is coupled to the second output line 36.

Figure 5:
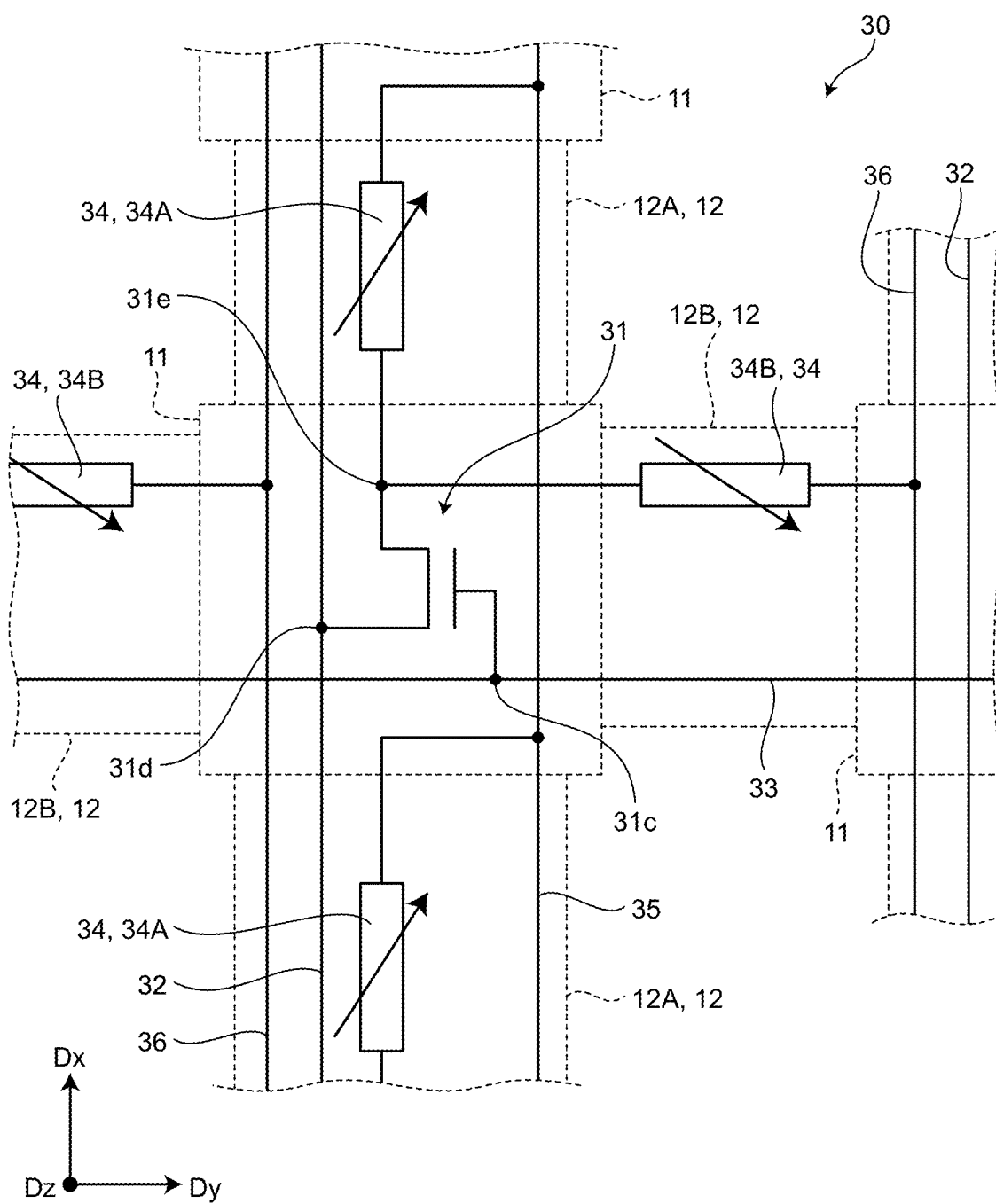
FIG. 5 is a diagram of the circuit configuration of the array layer stacked on the resin base member according to the first embodiment.

FIG. 5 is a diagram of the circuit configuration of the array layer stacked on the resin base member according to the first embodiment. In the circuit of the array layer described above, when the gate line 33 selected by the gate line drive circuit 7 is scanned, the transistor 31 is turned ON as illustrated in FIG. 5. As a result, the signal line 32 and one end of the strain gauge 34 are electrically coupled. Therefore, an electric current in the current wiring 9 flows to the strain gauges 34 (the longitudinal strain gauge 34A and the lateral strain gauge 34B). The electrical signal (electric current) from the longitudinal strain gauge 34A flows to the first output line 35. The electrical signal (electric current) from the lateral strain gauge 34B flows to the second output line 36. Subsequently, the first output line 35 or the second output line 36 selected by the output line selection circuit 8 is coupled to the drive IC. As a result, the electrical signal (electric current) from the first output line 35 or the second output line 36 is transmitted to the drive IC.

The following describes the sectional structure of the part of the array layer 30 stacked on the body 11.

Figure 6:
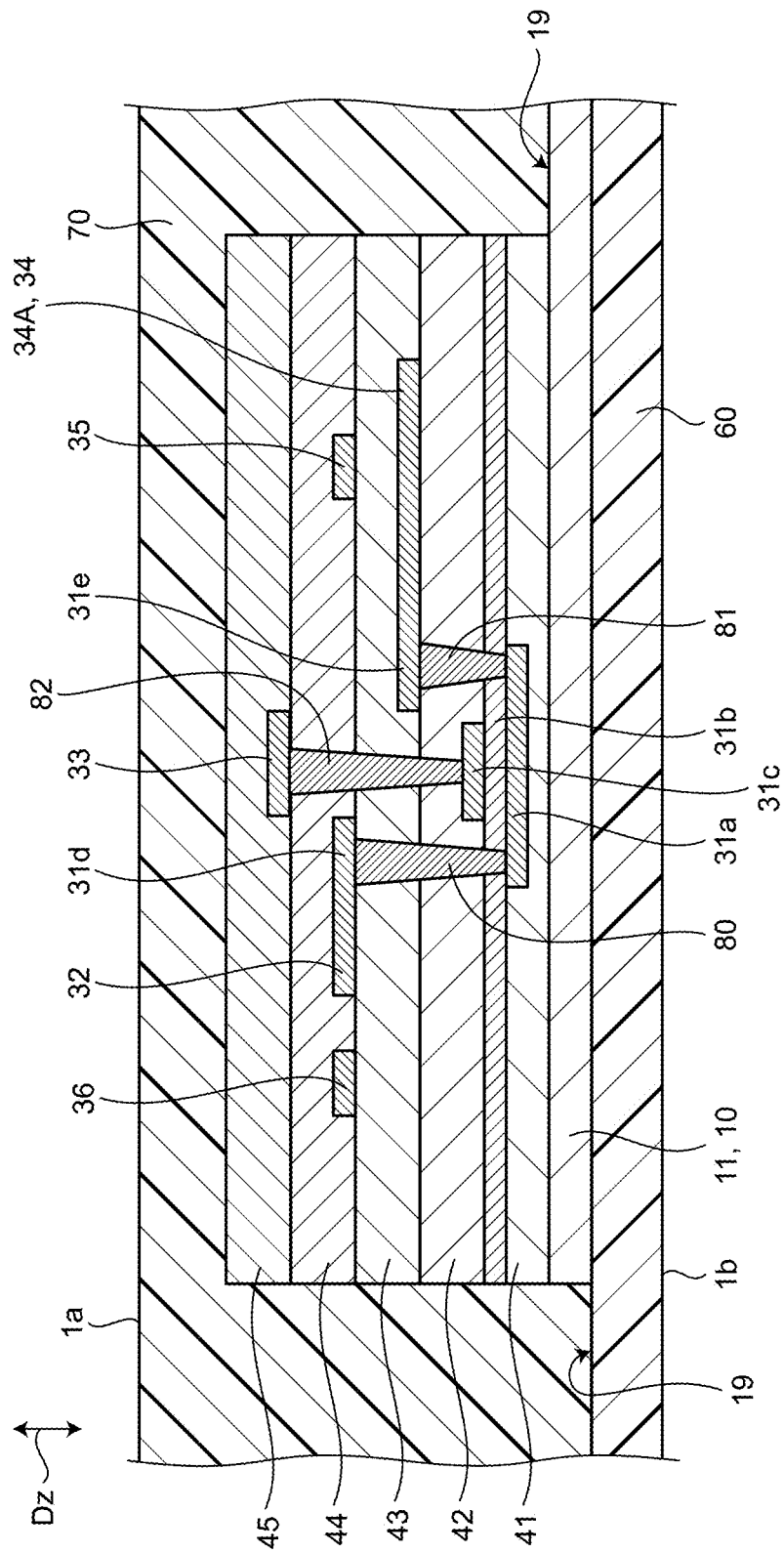
FIG. 6 is a sectional view seen in the arrow direction along line VI-VI of FIG. 4.

FIG. 6 is a sectional view seen in the arrow direction along line VI-VI of FIG. 4. As illustrated in FIG. 6, a plurality of insulating layers are stacked on the part of the array layer 30 stacked on the body 11. Specifically, a first insulating layer 41, a second insulating layer 42, a third insulating layer 43, a fourth insulating layer 44, and a fifth insulating layer 45 are stacked above the body 11. The first insulating layer 41, the second insulating layer 42, the third insulating layer 43, the fourth insulating layer 44, and the fifth insulating layer 45 are silicon oxide films, for example, and cover the transistor 31 and various kinds of wiring (the signal line 32, the gate line 33, the strain gauge 34, the first output line 35, and the second output line 36). In the configuration according to the present embodiment, a gate insulating film 31b of the transistor 31 is interposed between the first insulating layer 41 and the second insulating layer 42.

The strain gauge 34 is stacked on the second insulating layer 42. The signal line 32 is stacked on the third insulating layer 43. The gate line 33 is stacked on the fourth insulating layer 44. The transistor 31 includes a semiconductor layer 31a, the gate insulating film 31b, the gate electrode 31c, the drain electrode 31d, and the source electrode 31e. The semiconductor layer 31a is coupled to the drain electrode 31d and the source electrode 31e via contact layers 80 and 81. The gate electrode 31c is coupled to the gate line 33 via a contact layer 82. The drain electrode 31d is disposed in the same layer as that of the signal line 32 and is coupled to the signal line 32. The source electrode 31e is disposed in the same layer as that of the strain gauge 34 and is coupled to the strain gauge 34.

The following describes the part of the array layer 30 stacked on the hinge 12. Before that, the hinge 12 is described in greater detail. When the longitudinal hinge 12A is rotated by 90 degrees, it has the same shape as that of the lateral hinge 12B. Therefore, the longitudinal hinge 12A is described below as a representative example.

Figure 7:
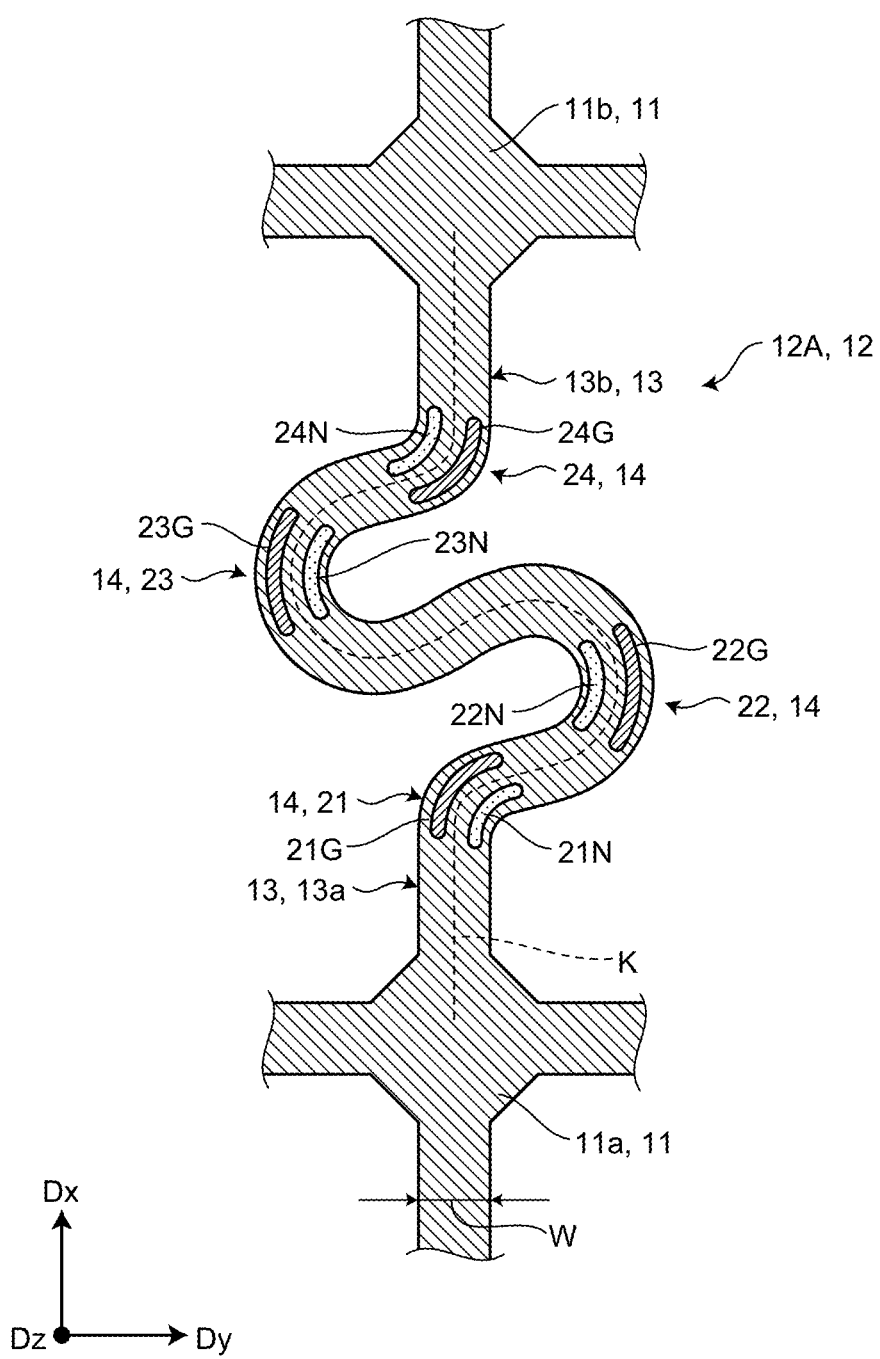
FIG. 7 is an enlarged view of a longitudinal hinge according to the first embodiment.
Figure 8:
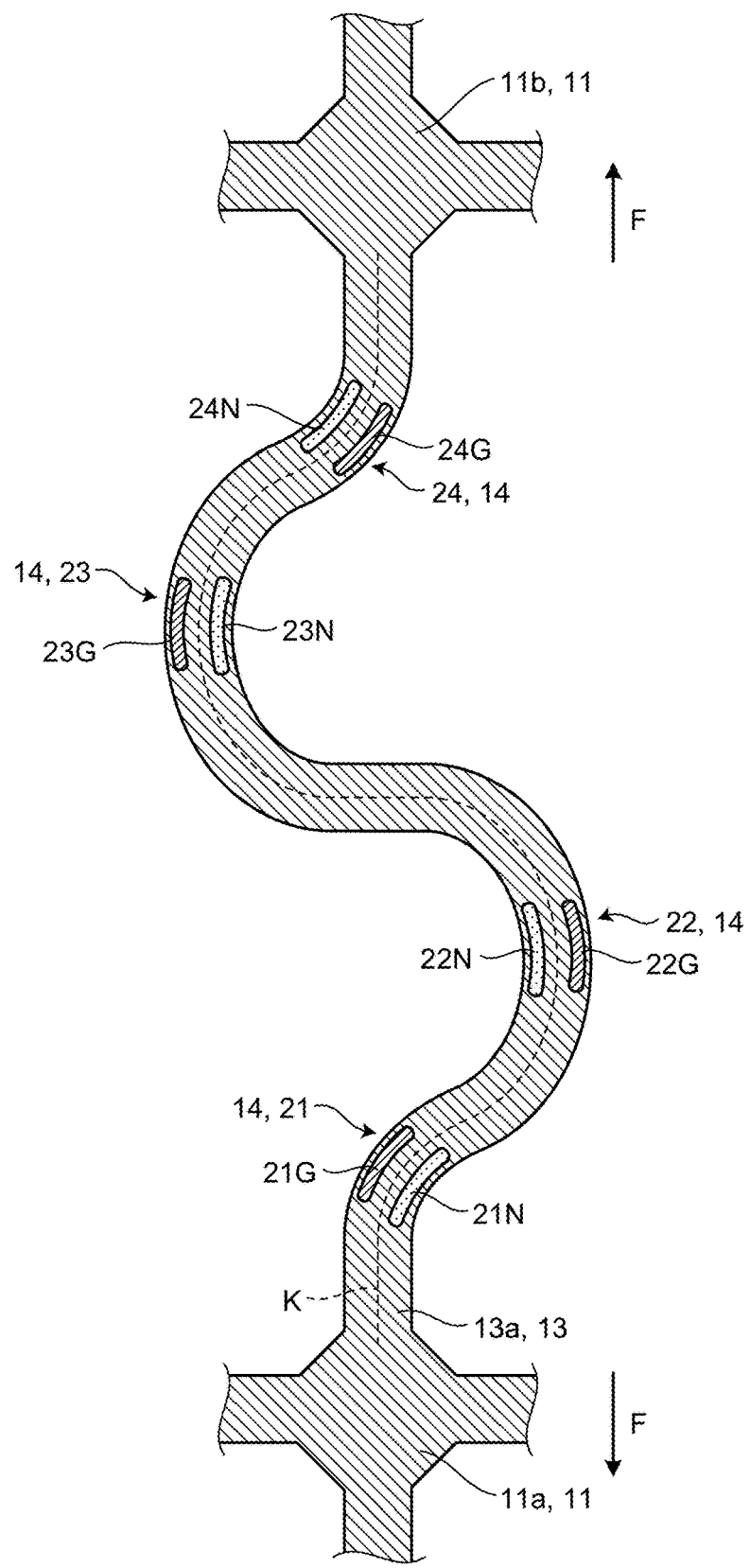
FIG. 8 is an enlarged view of the longitudinal hinge according to the first embodiment when a load that stretches the longitudinal hinge in a first direction is applied.

FIG. 7 is an enlarged view of the longitudinal hinge according to the first embodiment. FIG. 8 is an enlarged view of the longitudinal hinge according to the first embodiment when a load that stretches the longitudinal hinge in the first direction is applied. An imaginary line K illustrated in FIGS. 7 and 8 passes through the center of the longitudinal hinge 12A in the width direction.

As illustrated in FIG. 7, a length W of the longitudinal hinge 12A in the width direction is constant in the length direction in which the longitudinal hinge 12A extends. The longitudinal hinge 12A extends in the first direction Dx while meandering between two bodies 11. The longitudinal hinge 12A includes two bases 13 and four bends 14. The two bases 13 are disposed at both ends of the longitudinal hinge 12A in the length direction. The four bends 14 are disposed between the two bases 13. For the convenience of explanation, one of the two bodies 11 that sandwich the longitudinal hinge 12A is referred to as a first body 11a, and the other is referred to as a second body 11b.

The base 13 is continuous with the body 11 and linearly extends from the body 11 in the first direction Dx. One of the two bases 13 provided continuously with the first body 11a is referred to as a first base 13a, and the other provided continuously with the second body 11b is referred to as a second base 13b.

The bend 14 is bent in the second direction Dy. The bend 14 according to the present embodiment has an arc shape. The bend according to the present disclosure does not necessarily have an arc shape and may have an angular shape. The four bends 14 are a first arc 21, a second arc 22, a third arc 23, and a fourth arc 24 arranged in the order as listed from the first base 13a to the second base 13b. The first arc 21 and the fourth arc 24 each form a quadrant and are bent at 90 degrees. The second arc 22 and the third arc 23 each form a semi-circular arc and are bent at 180 degrees.

One end of the first arc 21 is coupled to the first base 13a. The first arc 21 is bent to one side in the second direction Dy with respect to the first base 13a. One end of the fourth arc 24 is coupled to the second base 13b. The fourth arc 24 is bent from the second base 13b to the other side in the second direction Dy. Therefore, the first arc 21 and the fourth arc 24 are bent in opposite directions.

One end of the second arc 22 is coupled to the first arc 21. The other end of the second arc 22 faces the other side in the second direction Dy. One end of the third arc 23 is coupled to the fourth arc 24, and the other end thereof faces the one side in the second direction Dy and is coupled to the other end of the second arc 22. Thus, the longitudinal hinge 12A meanders by the four bends 14.

As illustrated in FIG. 7, each bend 14 is divided into two portions: an inner peripheral portion positioned on the inner side (inner peripheral side) and an outer peripheral portion positioned on the outer side (outer peripheral side) with respect to the imaginary line K serving as the boundary. In FIG. 7, the inner peripheral portion and the outer peripheral portion of each bend 14 are enclosed by ellipses to define the areas of the inner peripheral portion and the outer peripheral portion. However, the entire area on the inner peripheral side with respect to the imaginary line K is the inner peripheral portion, and the entire area on the outer peripheral side with respect to the imaginary line K is the outer peripheral portion. Therefore, the area enclosed by the ellipse is part of the inner peripheral portion or the outer peripheral portion.

When the stretchable device 1 is pulled in the first direction Dx (refer to arrow F in FIG. 8), for example, the longitudinal hinge 12A stretches in the first direction Dx as illustrated in FIG. 8. In other words, the bending angle of each bend 14 increases, and the length of the longitudinal hinge 12A in the first direction Dx increases. When the bending angle of each bend 14 increases, the following loads (stresses) act on the inner peripheral portion and the outer peripheral portion of each bend 14.

A tensile load acts on a first inner peripheral portion 21N of the first arc 21. A compressive load acts on a first outer peripheral portion 21G of the first arc 21. A tensile load acts on a second inner peripheral portion 22N of the second arc 22. A compressive load acts on a second outer peripheral portion 22G of the second arc 22. A tensile load acts on a third inner peripheral portion 23N of the third arc 23. A compressive load acts on a third outer peripheral portion 23G of the third arc 23. A tensile load acts on a fourth inner peripheral portion 24N of the fourth arc 24. A compressive load acts on a fourth outer peripheral portion 24G of the fourth arc 24.

In other words, a tensile load acts on the inner peripheral portion of each bend 14, and a compressive load acts on the outer peripheral portion of each bend 14. Therefore, if the longitudinal strain gauge 34A extends along the end of the longitudinal hinge 12A, both tensile and compressive loads act on it. As a result, the load acting on the longitudinal hinge 12A fails to be accurately detected. The amount of generated strain is smaller in the center of the longitudinal hinge 12A in the width direction (area overlapping the imaginary line K) than in the inner peripheral portion and the outer peripheral portion.

Figure 9:
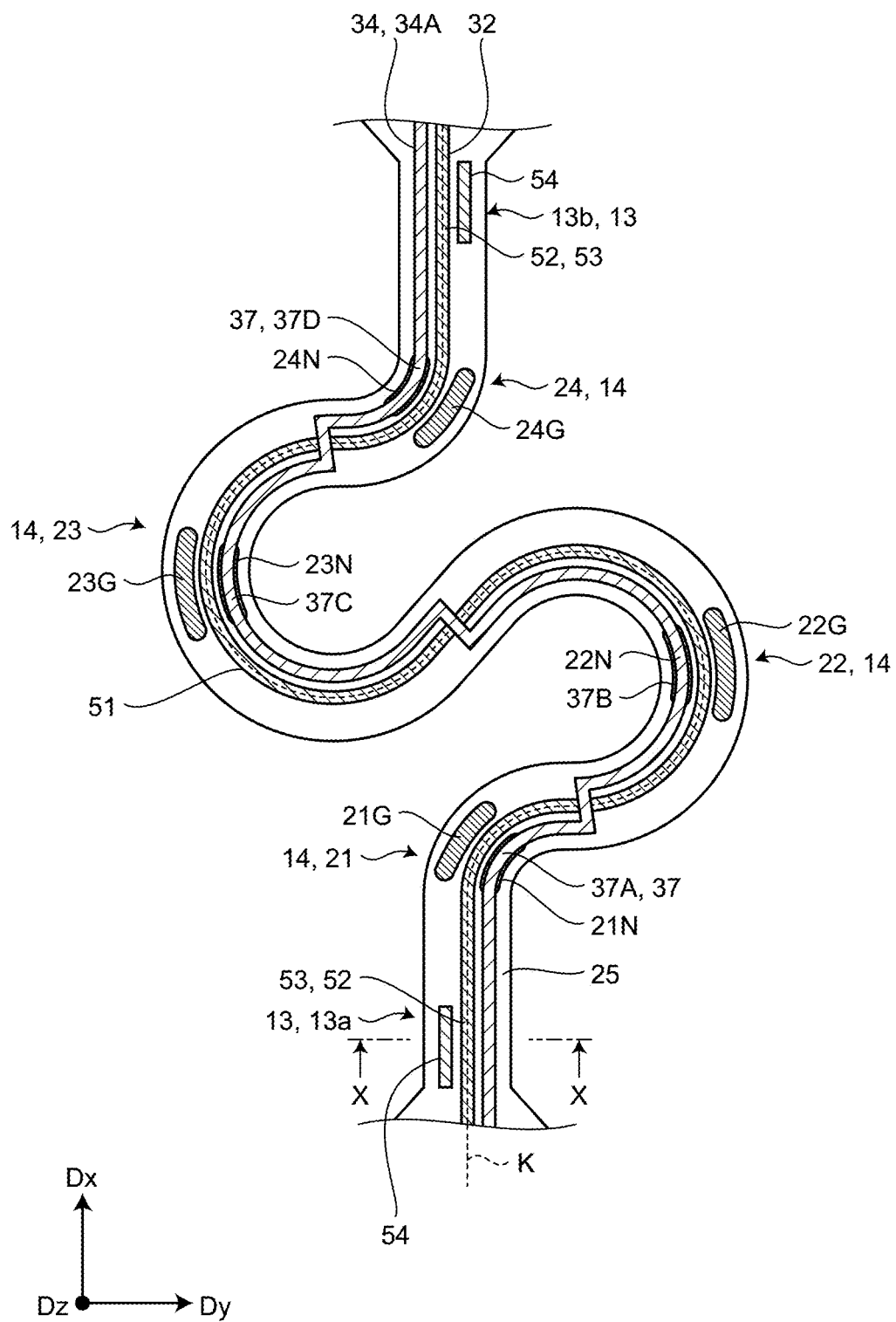
FIG. 9 is a plan view of a part of the array layer according to the first embodiment stacked on the longitudinal hinge viewed from the second resin plate.
Figure 10:
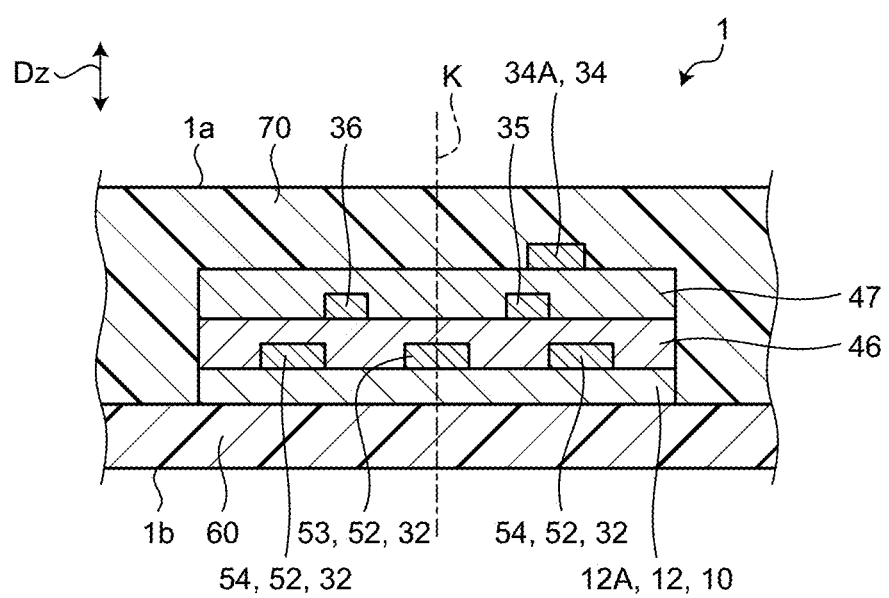
FIG. 10 is a sectional view seen in the arrow direction along line X-X of FIG. 9.
Figure 11:
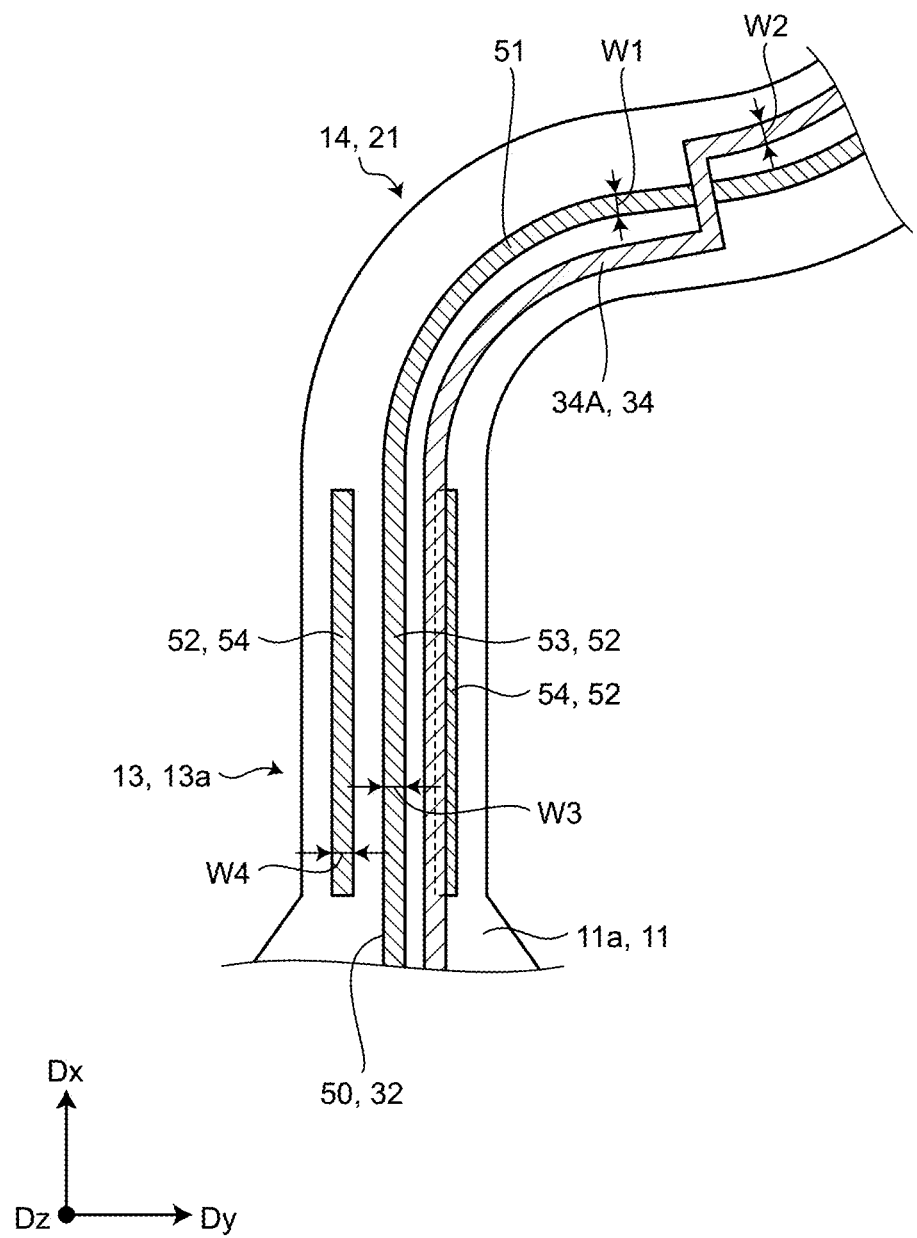
FIG. 11 is a plan view of a first base of the longitudinal hinge viewed from the second resin plate.

FIG. 9 is a plan view of a part of the array layer according to the first embodiment stacked on the longitudinal hinge viewed from the second resin plate. FIG. 10 is a sectional view seen in the arrow direction along line X-X of FIG. 9. FIG. 11 is a plan view of the first base of the longitudinal hinge viewed from the second resin plate. The following describes the part of the array layer 30 stacked on the longitudinal hinge 12A. The part is described in the order of the sectional structure and the layout in plan view.

As illustrated in FIG. 10, the part of the array layer 30 stacked on the longitudinal hinge 12A includes the signal line 32, the longitudinal strain gauge 34A, the first output line 35, the second output line 36, and insulating layers 46 and 47.

The signal line 32 is stacked on the longitudinal hinge 12A. The insulating layer 46 covers the signal line 32 and the longitudinal hinge 12A from above. The first output line 35 and the second output line 36 are stacked on the insulating layer 46. The insulating layer 47 covers the first output line 35, the second output line 36, and the insulating layer 46 from above. The longitudinal strain gauge 34A is provided on the insulating layer 47. The longitudinal strain gauge 34A is covered by the second resin plate 70. The insulating layers 46 and 47 are made of highly flexible polyimide.

In the layout in plan view, the longitudinal strain gauge 34A includes a plurality of strain detectors 37 overlapping the bends 14 in plan view as illustrated in FIG. 9. The strain detectors 37 include a first strain detector 37A overlapping the first arc 21, a second strain detector 37B overlapping the second arc 22, a third strain detector 37C overlapping the third arc 23, and a fourth strain detector 37D overlapping the fourth arc 24.

The first strain detector 37A overlaps the first inner peripheral portion 21N in plan view. The second strain detector 37B overlaps the second inner peripheral portion 22N in plan view. The third strain detector 37C overlaps the third inner peripheral portion 23N in plan view. The fourth strain detector 37D overlaps the fourth inner peripheral portion 24N in plan view.

Thus, the longitudinal strain gauge 34A is disposed overlapping only the inner peripheral portion of each bend 14 and not overlapping the outer peripheral portion. This configuration reduces application of both tensile and compressive loads to the longitudinal strain gauge 34A when the longitudinal hinge 12A expands or contracts. As a result, the load (amount of strain) acting on the longitudinal hinge 12A can be accurately detected. The strain gauge according to the present disclosure may be disposed so as to overlap only the outer peripheral portion of each bend 14. The amount of generated strain is smaller in the center of the longitudinal hinge 12A in the width direction (area overlapping the imaginary line K) than in the inner peripheral portion and the outer peripheral portion.

The signal line 32 includes a bend signal line 51 and a base signal line 52 stacked on the longitudinal hinge 12A. The base signal line 52 is provided to each of the first base 13a and the second base 13b. The following describes the base signal line 52 stacked on the first base 13a.

The bend signal line 51 is stacked on a plurality of bends 14. The bend signal line 51 passes through the center of the longitudinal hinge 12A in the width direction. Therefore, the bend signal line 51 meanders along the bends 14. With this configuration, the bend signal line 51 overlaps in plan view with the imaginary line K having a smaller amount of strain than the inner peripheral portions and the outer peripheral portions of the bends 14. Therefore, the amount of strain generated in the bend signal line 51 is reduced.

As illustrated in FIG. 11, a length W1 of the bend signal line 51 in the width direction is smaller than a length W2 of the longitudinal strain gauge 34A in the width direction. As the bend signal line 51 becomes thicker (as the length W1 of the bend signal line 51 in the width direction increases), the amount of strain generated in the bend signal line 51 increases, and the noise components increase. For this reason, the present embodiment makes the length W1 of the bend signal line 51 in the width direction smaller (makes the bend signal line 51 thinner), thereby reducing the contained noise components. In the present disclosure, the length W1 of the bend signal line 51 in the width direction simply needs to be smaller than the length W2 of the longitudinal strain gauge 34A in the width direction and equal to or larger than one-third the length W2 of the longitudinal strain gauge 34A in the width direction ($W2 > W1 \geq W2 \times 1/3$).

As illustrated in FIG. 11, the base signal line 52 is stacked on the base 13. The base signal line 52 includes one signal line body 53 and two dummy wiring lines 54 disposed sandwiching the signal line body 53.

The signal line body 53 and the dummy wiring lines 54 each linearly extend along the first base 13a. One end of the signal line body 53 is coupled to the body signal line 50, and the other end thereof is coupled to the bend signal line 51. Therefore, the electric current flowing from the current wiring 9 (refer to FIG. 1) flows in the first direction Dx through the body signal line 50, the bend signal line 51, and the signal line body 53. By contrast, neither of the ends of each dummy wiring line 54 is coupled to other wiring. Therefore, the dummy wiring lines 54 are disconnected. One of the two dummy wiring lines 54 overlapping the longitudinal strain gauge 34A is not illustrated in FIG. 9.

A length W3 of the signal line body 53 in the width direction is equal to the length W1 of the bend signal line 51 in the width direction. Therefore, the base signal line 52 (the signal line body 53 and the dummy wiring lines 54) has a larger occupied area per unit length in the length direction of the longitudinal hinge 12A than the bend signal line 51. In other words, the base signal line 52 has a larger occupied area per unit length than the bend signal line 51 because it includes the two dummy wiring lines 54. Therefore, the rigidity of the first base 13a is improved compared with the case where the two dummy wiring lines 54 are not provided. As a result, the amount of strain generated in the first base 13a is reduced when the longitudinal hinge 12A expands or contracts. Therefore, the amount of strain generated in the signal line body 53 is also reduced.

A length W4 of each dummy wiring line 54 in the width direction is longer than the length W3 of the signal line body 53 in the width direction. Therefore, the rigidity of the first base 13a is improved, and the amount of strain generated in the signal line body 53 is reduced compared with the case where the length W4 of the dummy wiring line 54 in the width direction is equal to the length W3 of the signal line body 53. The length W4 of the dummy wiring line 54 in the width direction according to the present disclosure is not limited to the example described in the first embodiment and may be equal to or smaller than the length W3 of the signal line body 53.

As described above, the stretchable device 1 according to the first embodiment has a smaller amount of strain generated in the bend signal line 51 and the signal line body 53 and can accurately detect the amount of strain in the hinge 12. While two dummy wiring lines 54 are provided in the configuration according to the first embodiment, the present disclosure has no particular limitation on the number of dummy wiring lines 54. While the dummy wiring lines 54 according to the first embodiment have a linear shape, the shape of the dummy wiring lines according to the present disclosure may be other than a linear shape and is not particularly limited. Next, other embodiments obtained by modifying part of the first embodiment are described. The following describes the other embodiments focusing on the differences from the first embodiment.

Second Embodiment

Figure 12:
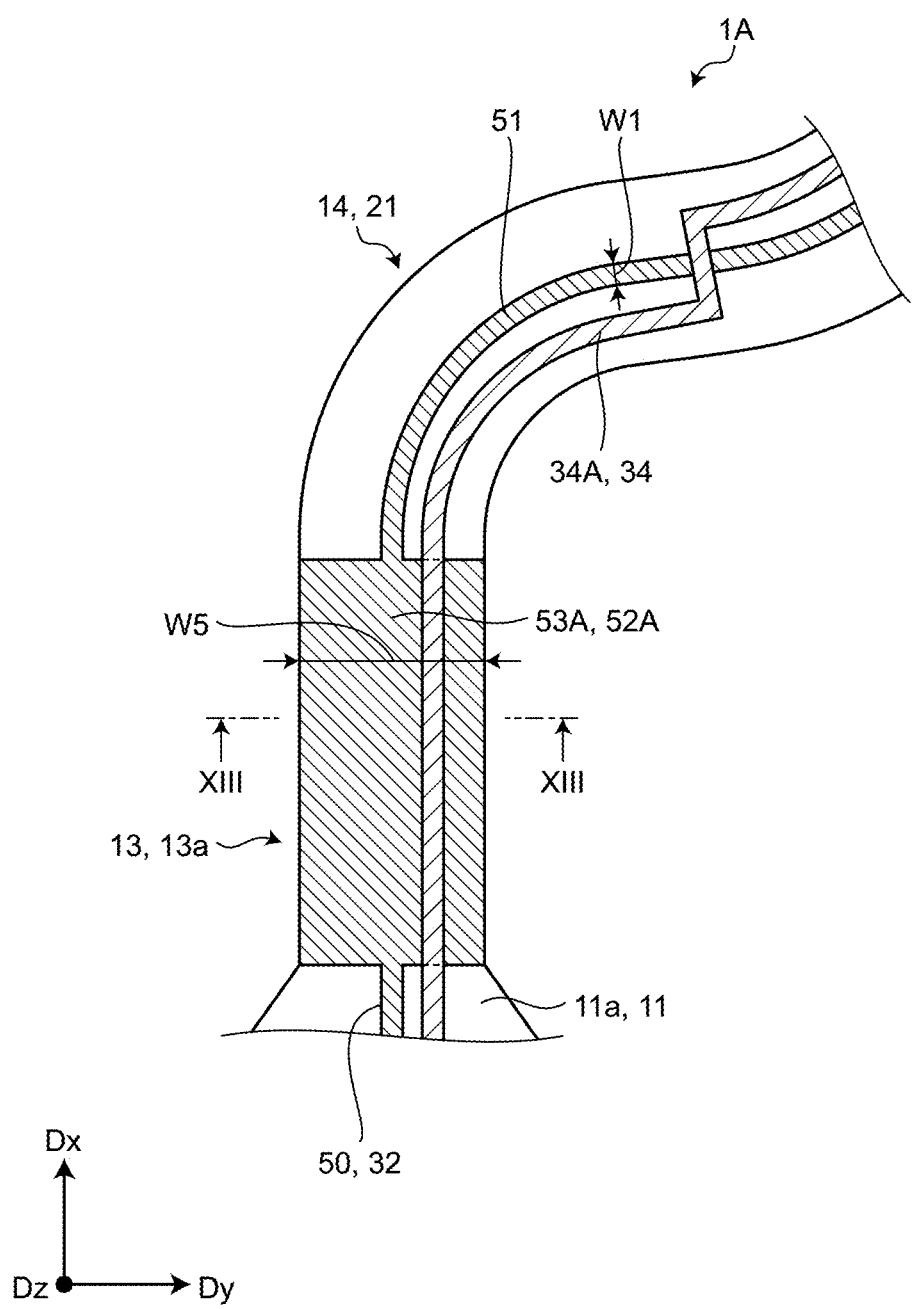
FIG. 12 is a plan view of the first base of the longitudinal hinge according to a second embodiment viewed from the second resin plate.
Figure 13:
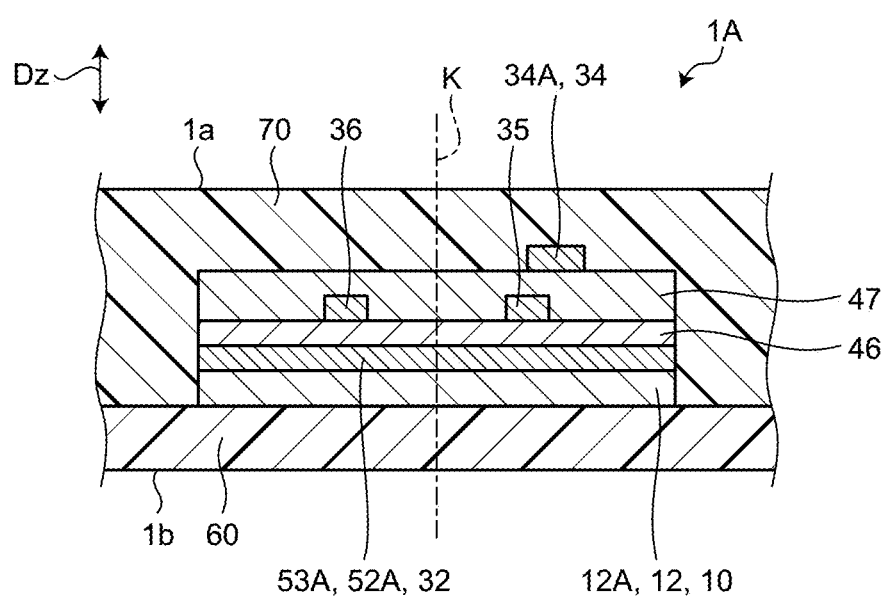
FIG. 13 is a sectional view seen in the arrow direction along line XII-XII of FIG. 12.

FIG. 12 is a plan view of the first base of the longitudinal hinge according to a second embodiment viewed from the second resin plate. FIG. 13 is a sectional view seen in the arrow direction along line XII-XII of FIG. 12. As illustrated in FIGS. 12 and 13, a stretchable device 1A according to the second embodiment is different from the stretchable device 1 according to the first embodiment in that a base signal line 52A includes only a signal line body 53A coupled to the bend signal line 51. In other words, the base signal line 52A of the stretchable device 1A according to the second embodiment does not include the dummy wiring lines 54.

A length W5 of the signal line body 53A in the width direction is equal to the length of the first base 13a in the width direction. In other words, the length W5 of the signal line body 53A in the width direction is larger than the length W1 of the bend signal line 51 in the width direction. Therefore, the base signal line 52A according to the second embodiment also has a larger occupied area per unit length in the length direction of the signal line 32 than the bend signal line 51. With this configuration, the rigidity of the first base 13a is improved, and the amount of strain generated in the signal line body 53A is reduced. Therefore, the amount of strain in the hinge 12 can be accurately detected.

Third Embodiment

Figure 14:
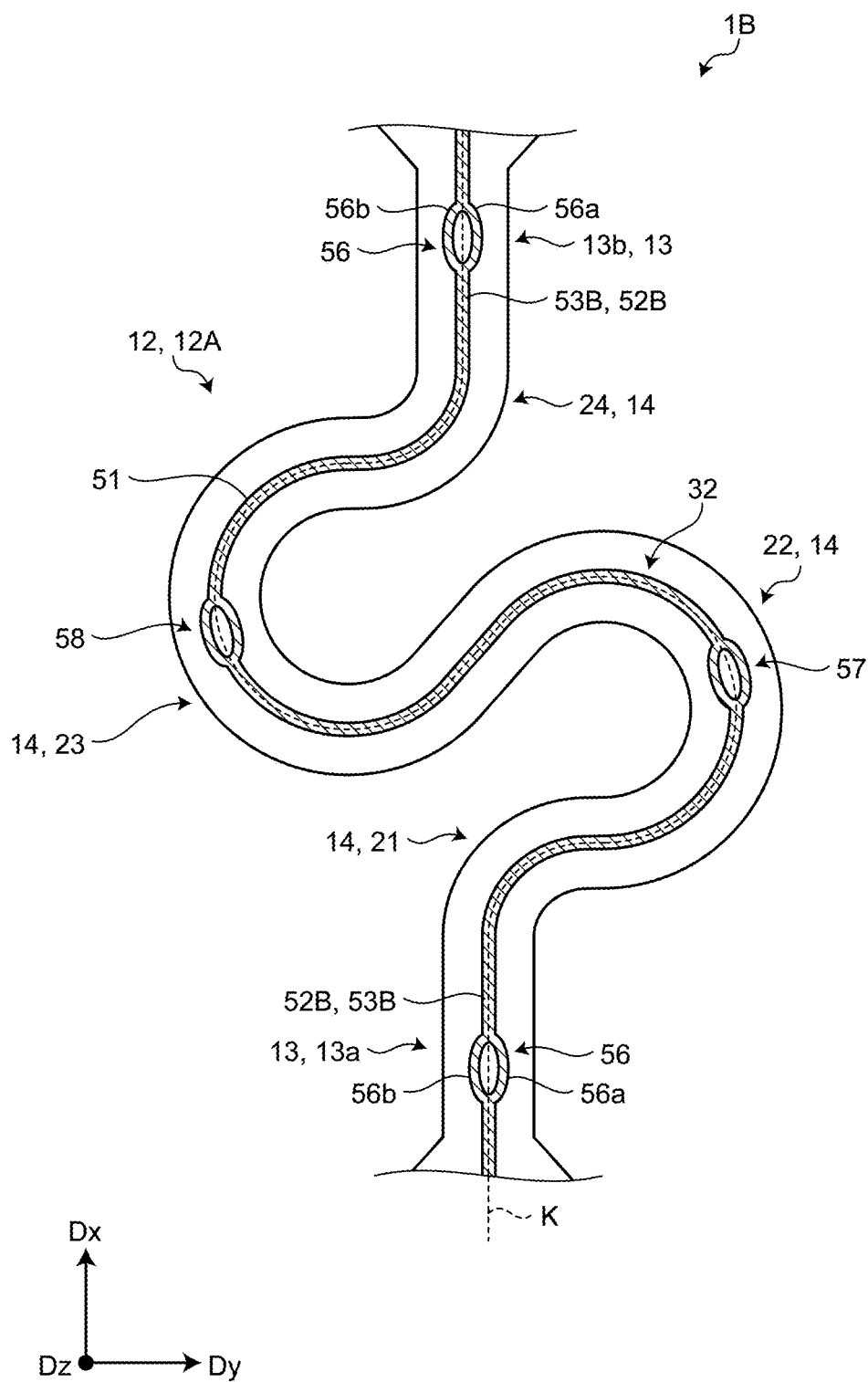
FIG. 14 is a plan view of the longitudinal hinge according to a third embodiment viewed from the second resin plate.

FIG. 14 is a plan view of the longitudinal hinge according to a third embodiment viewed from the second resin plate. The longitudinal strain gauge 34A is not illustrated in FIG. 14. As illustrated in FIG. 14, a stretchable device 1B according to the third embodiment is different from the stretchable device 1 according to the first embodiment in that a base signal line 52B of the signal line 32 includes only a signal line body 53B coupled to a bend signal line 51B. The signal line body 53B is different from the signal line body 53 according to the first embodiment in that an annular portion 56 is provided to part of the signal line body 53B.

The annular portion 56 has an annular shape when viewed in the third direction Dz. The annular portion 56 according to the present embodiment has an elliptic shape. The shape of the annular portion according to the present disclosure is not limited to an elliptic shape and may be a circular or rectangular shape. The annular portion 56 includes a first wiring line 56a and a second wiring line 56b. The first wiring line 56a is disposed on one side in the second direction Dy with respect to the imaginary line K, and the second wiring line 56b is disposed on the other side in the second direction Dy with respect to the imaginary line K. The annular portion 56 distributes the stress to the first wiring line 56a and the second wiring line 56b when the longitudinal hinge 12A expands or contracts, thereby reducing the amount of strain.

The bend signal line 51B according to the third embodiment also includes two annular portions 57 and 58. The annular portion 57 is positioned at the center of the second arc 22 in the length direction. The annular portion 58 is positioned at the center of the third arc 23 in the length direction. The centers of the second arc 22 and the third arc 23 in the length direction are the points where a relatively large amount of strain is likely to be generated out of the four bends 14. With this configuration, the amount of strain generated in the bend signal line 51B can also be reduced.

While the third embodiment has been described above, the annular portion 56 according to the present disclosure may be provided only to the signal line body 53B. Two annular portions 56 may be provided to the signal line body 53B, and the number of annular portions 56 is not particularly limited. The annular portion 56 according to the present disclosure simply needs to be provided to at least part of the signal line body 53B. In other words, the annular portion 56 may be provided to part of the signal line body 53B as described in the third embodiment or to the entire signal line body 53B. The annular portions 56 and 57 provided to the bend signal line 51B may be used in the stretchable device 1 according to the first embodiment and the stretchable device 1A according to the second embodiment.

What is claimed is:
1. A stretchable device comprising:
a resin base member; and
a signal line and a strain gauge stacked on the resin base member, wherein
the resin base member comprises:
   a plurality of bodies disposed separately from each other; and
   a plurality of hinges that couple the bodies while meandering,
the hinges each comprise:
   a plurality of bends that bend and are disposed between the bodies; and
   a base that linearly extends to couple one of the bodies to a corresponding one of the bends,
the signal line comprises:
   a bend signal line stacked on the bends; and
   a base signal line stacked on the base, and
the base signal line has an occupied area per unit length in a length direction of the signal line larger than the bend signal line when viewed in a stacking direction in which the signal line is stacked on the resin base member.

2. The stretchable device according to claim 1, wherein the base signal line comprises:
   a signal line body that has the same width as a width of the bend signal line when viewed in the stacking direction and is coupled to the bend signal line; and
   a dummy wiring line disposed separately from the signal line body.

3. The stretchable device according to claim 2, wherein a width of the bend signal line is shorter than a width of the strain gauge when viewed in the stacking direction.

4. The stretchable device according to claim 1, wherein the base signal line comprises a signal line body coupled to the bend signal line, and
a width of the signal line body is larger than a width of the base signal line when viewed in the stacking direction.

5. The stretchable device according to claim 4, wherein a width of the bend signal line is shorter than a width of the strain gauge when viewed in the stacking direction.

6. The stretchable device according to claim 1, wherein a width of the bend signal line is shorter than a width of the strain gauge when viewed in the stacking direction.

7. A stretchable device comprising:
a resin base member; and
a signal line and a strain gauge stacked on the resin base member, wherein
the resin base member comprises:
   a plurality of bodies disposed separately from each other; and
   a plurality of hinges that couple the bodies while meandering,
the hinges each comprise:
   a plurality of bends that bend and are disposed between the bodies; and
   a base that linearly extends to couple one of the bodies to a corresponding one of the bends,
the signal line comprises:
   a bend signal line stacked on the bends; and
   a base signal line stacked on the base,
the base signal line comprises a signal line body coupled to the bend signal line, and
an annular portion having an annular shape when viewed in a stacking direction in which the signal line is stacked on the resin base member is provided to at least part of the signal line body.

8. The stretchable device according to claim 7, wherein the annular portion is provided to at least part of the bend signal line.

9. The stretchable device according to claim 8, wherein a width of the bend signal line is shorter than a width of the strain gauge when viewed in the stacking direction.

10. The stretchable device according to claim 7, wherein a width of the bend signal line is shorter than a width of the strain gauge when viewed in the stacking direction.

* * * * *